(12) United States Patent
Long et al.

(10) Patent No.: US 8,742,666 B2
(45) Date of Patent: Jun. 3, 2014

(54) RADIO FREQUENCY (RF) POWER FILTERS AND PLASMA PROCESSING SYSTEMS INCLUDING RF POWER FILTERS

(75) Inventors: Maolin Long, Cupertino, CA (US); Ralph Lu, Newark, CA (US); Fred Egley, Sunnyvale, CA (US); Thomas Anderson, Hayward, CA (US); Seyed Jafar Jafarian-Tehrani, Fremont, CA (US); Michael Giarratano, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 417 days.

(21) Appl. No.: 12/960,706

(22) Filed: Dec. 6, 2010

(65) Prior Publication Data

US 2012/0032756 A1    Feb. 9, 2012

Related U.S. Application Data

(60) Provisional application No. 61/371,424, filed on Aug. 6, 2010.

(51) Int. Cl.
*H05H 1/46* (2006.01)
*H03H 1/00* (2006.01)
*H03H 7/01* (2006.01)

(52) U.S. Cl.
CPC ............... *H05H 1/46* (2013.01); *H03H 1/0007* (2013.01); *H03H 7/01* (2013.01)
USPC ..................................... 315/111.21; 333/181

(58) Field of Classification Search
CPC .......... H03H 1/0007; H03H 7/01; H05H 1/46
USPC .......... 333/181; 336/192; 315/111.21–111.91
See application file for complete search history.

(56) References Cited

U.S. PATENT DOCUMENTS

| | | | | |
|---|---|---|---|---|
| 5,689,218 A | * | 11/1997 | Stein et al. | 333/125 |
| 5,726,611 A | * | 3/1998 | Takagi et al. | 333/181 |
| 7,052,283 B2 | * | 5/2006 | Pixley et al. | 439/620.03 |
| 2003/0107459 A1 | | 6/2003 | Takahashi et al. | |
| 2006/0125579 A1 | | 6/2006 | Baleras et al. | |
| 2007/1028434 | | 12/2007 | Todorov et al, | |
| 2008/0024250 A1 | * | 1/2008 | Park et al. | 333/24 C |

OTHER PUBLICATIONS

"International Search Report", PCT Application No. PCT/US2011/045722, Mailing Date: Feb. 28, 2012.
"Written Opinion", PCT Application No. PCT/US2011/045722, Mailing Date: Feb. 28, 2012.

* cited by examiner

*Primary Examiner* — Benny Lee
*Assistant Examiner* — Rakesh Patel
(74) *Attorney, Agent, or Firm* — Martine Penilla Group, LLP

(57) ABSTRACT

A filter for filtering radio frequency (RF) power transmitted from an electrostatic chuck (ESC) in a plasma processing system. The plasma processing system may include a heating element disposed at the ESC. The plasma processing system may further include a power supply. The filter may include a core member and a cable wound around and wound along the core member to form a set of inductors. The cable may include a plurality of wires, including a first wire and a second wire, a portion of the first wire and a portion of the second wire being twisted together, a first end of the first wire and a first end of the second wire being connected to the heating element, each of a second end of the first wire and a second end of the second wire being connected to a capacitor and being connected to the power supply.

14 Claims, 5 Drawing Sheets

RADIO FREQUENCY (RF) POWER FILTERS AND PLASMA PROCESSING SYSTEMS INCLUDING RF POWER FILTERS

CROSS REFERENCE TO RELATED APPLICATION

The present invention claims priority under 35 U.S.C. 119(e) to a commonly owned provisionally filed patent application entitled "MULTI-FREQUENCY RF FILTER SYSTEMS FOR TUNABLE ELECTROSTATIC CHUCKS IN SEMICONDUCTOR PLASMA PROCESSING SYSTEMS AND METHODS THEREFOR," U.S. Application No. 61/371,424, filed on 6 Aug. 2010, by inventors Maolin Long, Ralph Lu, Fred Egley, Thomas Anderson, Seyed Jafar Jafarian-Tehrani, and Michael Giarratano, all of which is incorporated herein by reference.

BACKGROUND OF THE INVENTION

The present invention is related to radio frequency (RF) power filters. In particular, the present invention is related to RF power filters for use in plasma processing systems.

Plasma processing systems, such as capacitively coupled plasma (CCP) systems, inductively coupled plasma (ICP) systems, and transformer coupled plasma (TCP) systems, are employed in various industries for fabricating devices on wafers. For example, the industries may include semiconductor, magnetic read/write and storage, optical system, and micro-electromechanical system (MEMS) industries.

A plasma processing system may generate and sustain plasma in a plasma processing chamber to perform etching and/or deposition on a wafer such that device features may be formed on the wafer. The plasma processing system may include an electrostatic chuck (ESC) for supporting the wafer during one or more plasma processing processes. An ESC with zone-to-zone tunable temperature capability may be critical for temperature sensitive plasma processing processes. For minimizing electromagnetic compatibility (EMC) failure, interference issues, and power loss issues that may be caused by RF power transmitted from the ESC and leaked from the plasma processing chamber, an RF power filter may be implemented in the plasma processing system.

FIG. 1A shows a schematic representation illustrating several components of a plasma processing system 100. Plasma processing system 100 may include an ESC 108 that may support a wafer (well known in the art and not shown in this figure) during plasma processing of the wafer. In addition, ESC 108 may also serve as a lower electrode; ESC 108 may receive RF power supplied through an RF feed 120 for generating and/or sustaining plasma between ESC 108 and an upper electrode (well known in the art and not shown in this figure) for performing plasma processing.

ESC 108 may be a tunable ESC (TESC) capable of two-zone tunable temperature control. The temperature tuning capability of ESC 108 may be achieved by implementing two electric heating elements (well known in the art and not shown in the figure) embedded under the ceramic puck on top of ESC 108, one electric heating element being implemented for each of the two zones.

The two electric heating elements may be powered by alliterating currents (ACs) supplied by an AC power supply (well known in the art and not shown in the figure) through an AC connector 138, an RF power filter 102, a cable 104, and terminals 110a, 110b, 110c, and 110d. Two of terminals 110a, 110b, 110c, and 110d may be coupled to a first electric heating element of the two electric heating elements for powering the first electric heating element; the other two of terminals 110a, 110b, 110c, and 110d may be coupled to a second heating element of the two electric heating element for powering the second electric heating element. The temperature of each of the electric heating elements may be controlled in a bang-bang fashion with a zero crossing technique.

RF power filter 102 may transmit AC power for powering the electric heating elements. RF power filter 102 may also minimize or block RF power transmitted from ESC 108 to other components outside of plasma processing chamber body 106, for minimizing the abovementioned EMC failure issues, interference issues, and power loss issues.

Nevertheless, existing RF power filter designs may cause issues related to processing uniformity and performance consistency in plasma processing systems, as discussed with reference to the example of FIG. 1B.

FIG. 1B shows a schematic representation illustrating an example prior-art RF power filter 102 for use in a plasma processing system, such as plasma processing system 100 illustrated in the example of FIG. 1A. As illustrated in the example of FIG. 1B, RF power filter 102 may include an enclosure 150. RF power filter 102 may also include a core member 158 disposed inside enclosure 150. RF power filter 102 may also include a set of inductors 156 (including four inductors) formed by wire 166a, wire 166b, wire 166c, and wire 166d separately wound around and wound along a portion of core member 158. Wires 166a-166d may be connected through cable 104 (illustrated in the example of FIG. 1A) to terminals 110a-110d (illustrated in the example of FIG. 1A) for supplying AC power to the electric heaters. The set of inductors 156 (formed by wire 166a, wire 166b, wire 166c, and wire 166d, respectively) may be connected to a set of grounded capacitors 154 (including four capacitors) to form tuned circuits (or resonant circuits) to filter out or block RF power at the 60 MHz operating frequency transmitted from ESC 108 (illustrated in the example of FIG. 1A), for example, through cable 104 (illustrated in the example of FIG. 1A) and wires 166a-166d.

Given that wire 166a, wire 166b, wire 166c, and wire 166d are separated by significant distances, there are significant differences in stray capacitances formed between wire 166a and walls of enclosure 150, stray capacitances formed between wire 166b and walls of enclosure 150, stray capacitances formed between wire 166c and walls of enclosure 150, and stray capacitances formed between wire 166d and walls of enclosure 150. For example, the stray capacitance formed between a section of wire 166a and a side wall of enclosure 150 may be significantly different from the stray capacitance formed between a corresponding section of wire 166b and the same side wall of enclosure 150. As a result, at ESC 108 (illustrated in the example of FIG. 1A), the impedance level at terminal 110a (connected to wire 166a), the impedance level at terminal 110b (connected to wire 166b), the impedance level at terminal 110c (connected to wire 166c), and the impedance level at terminal 110d (connected to wire 166d) may be significantly different from each other. Consequently, plasma processing rates (e.g., etch rates) may be substantially non-uniform or substantially inconsistent across the surface of a wafer disposed on ESC 108, and the manufacturing yield may be substantially undesirable.

Typically, wires 166a-166d may be polytetrafluoroethylene (PTFE) wires or wires coated with PTFE, and core member 158 also may be coated with PTFE, for minimizing contamination. PTFE typically has a low coefficient of friction; therefore, wires 166a-166d may tend to move away from specified positions with respect to core member 158. As a result, the abovementioned stray capacitances may substantially change, and plasma processing profiles (e.g., etching profiles) may be substantially inconsistent from wafer to wafer, from RF power filter to RF power filter, and/or from plasma processing chamber to plasma processing chamber even if system specifications and processing recipes remain unchanged. As a result, for achieving acceptable consistency in plasma processing, costly and time-consuming calibration processes performed by highly skillful workers may be required.

In addition, the tolerances (or acceptable deviations from specified values) of the capacitors in the set of grounded capacitors 154 also may contribute to substantial variation (or substantial inconsistency) in plasma processing profiles (e.g., etch profiles) on wafers, from RF power filter to RF power filter, and/or from plasma processing chamber to plasma processing chamber.

RF power filter 102 may also include a set of inductors 152 (including four inductors) formed by wire 162a, wire 162b, wire 162c, and wire 162d separately wound around and wound along a portion of core member 158. Wires 162a-162d may be connected through wires 166a-166d and cable 104 (illustrated in the example of FIG. 1A) to terminals 110a-110d (illustrated in the example of FIG. 1A) for supplying AC power to the electric heaters. The set of inductors 152 (formed by wire 162a, wire 162b, wire 162c, and wire 162d, respectively) may be connected to a set of grounded capacitors 174 (including four capacitors) to form tuned circuits to filter out or block RF power at the 27 MHz operating frequency transmitted from ESC 108 (illustrated in the example of FIG. 1A).

RF power filter 102 may also include another core member 178 disposed inside enclosure 150. RF power filter 102 may also include a set of inductors 172 (including four inductors) formed by wire 182a, wire 182b, wire 182c, and wire 182d separately wound around and wound along a portion of core member 178. Wires 182a-182d may be connected through a set of wires 180 and AC connecter 138 (illustrated in the example of FIG. 1A) to an AC power supply. Wires 182a-182d may be connected through wires 162a-162d, wires 166a-166d, cable 104 (illustrated in the example of FIG. 1A) to terminals 110a-110d (illustrated in the example of FIG. 1A) for supplying AC power to the electric heaters. The set of inductors 172 (formed by wire 182a, wire 182b, wire 182c, and wire 182d, respectively) may be connected to a set of grounded capacitors 176 (including four capacitors) to form tuned circuits to filter out or block RF power at the 2 MHz operating frequency transmitted from ESC 108 (illustrated in the example of FIG. 1A).

Analogous to the significant distances (or space) between wires 166a-166d, the significant distances (or space) between wires 162a-162d and the significant distances (or space) between wires 182a-182d also may contribute to substantially non-uniform plasma processing rates on wafers and a substantially undesirable manufacturing yield.

Analogous to the movement (and repositioning) of wires 166a-166d, the movement (and repositioning) of wires 162a-162d and the movement (and repositioning) of wires 182a-182d also may contribute to substantial variation or substantial inconsistency in plasma processing profiles (e.g., etching profiles) from wafer to wafer, from RF power filter to RF power filter, and/or from plasma processing chamber to plasma processing chamber.

In addition, analogous to the tolerances of the capacitors in the set of grounded capacitors 154, the tolerances of the capacitors in the set of grounded capacitors 174 and the tolerances of the capacitors in the set of grounded capacitors 176 also may contribute to substantial variation (or substantial inconsistency) in plasma processing profiles on wafers, from RF power filter to RF power filter, and/or from plasma processing chamber to plasma processing chamber.

SUMMARY OF INVENTION

An embodiment of the invention is related to a filter for filtering radio frequency (RF) power transmitted from at least an electrostatic chuck (ESC) in a plasma processing system. The plasma processing system may include at least a heating element disposed at a portion of the ESC. The plasma processing system may further include at least a power supply. The filter may include a core member. The filter may also include a plurality of capacitors, the plurality of capacitors including at least a first capacitor and a second capacitor. The filter may also include a cable wound around and wound along at least a portion of the core member to form at least a set of inductors having a set of inductances. The cable may include at least a plurality of wires. The plurality of wires may include at least a first wire and a second wire, the first wire contacting the second wire, at least a portion of the first wire and at least a portion of the second wire being twisted together, a first end of the first wire being connected to the heating element, a second end of the first wire being connected to the first capacitor and being connected to the power supply, a first end of the second wire being connected to the heating element, a second end of the second wire being connected to the second capacitor and being connected to the power supply.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1A:
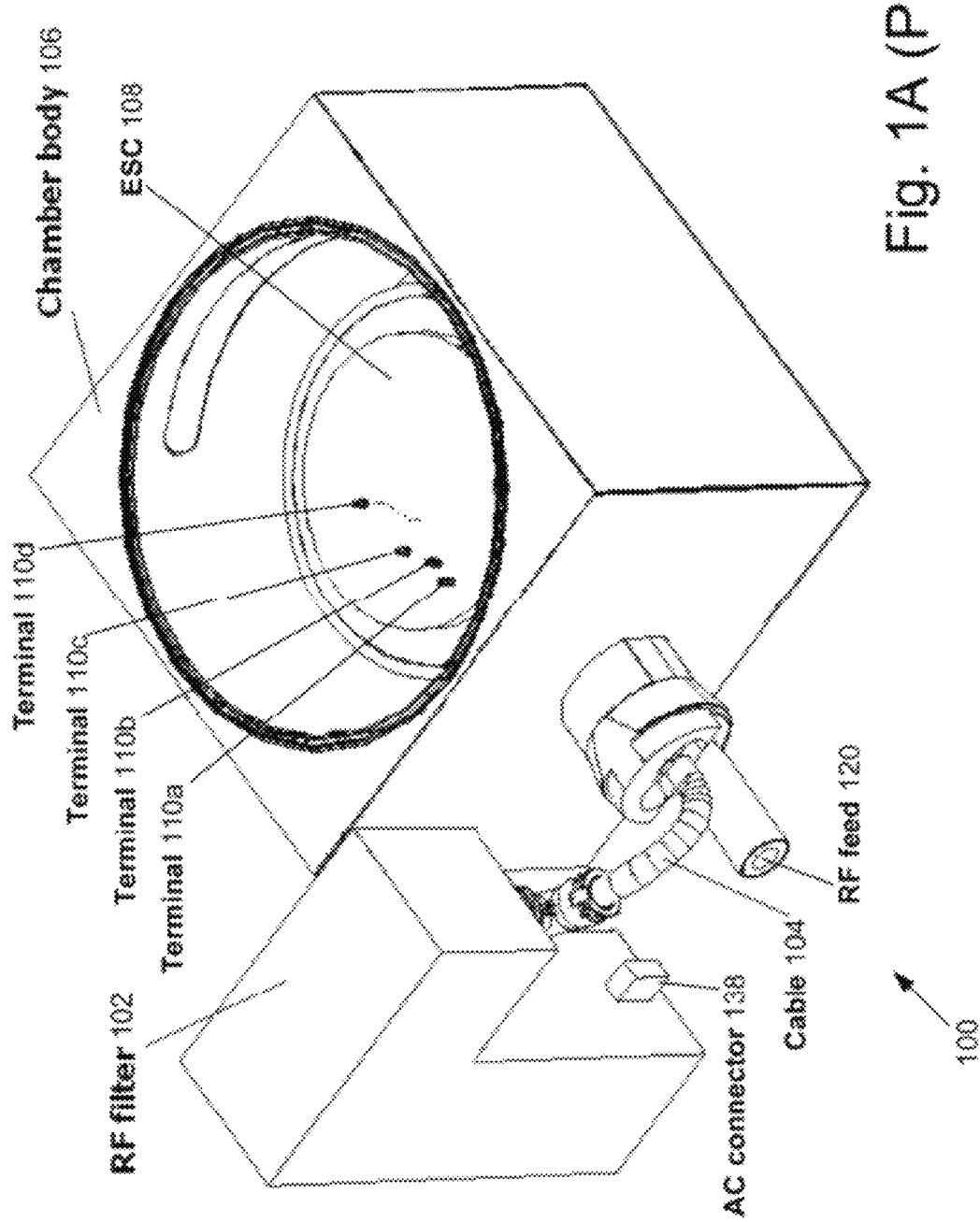
FIG. 1A shows a schematic representation illustrating several components of a plasma processing system.
Figure 1B:
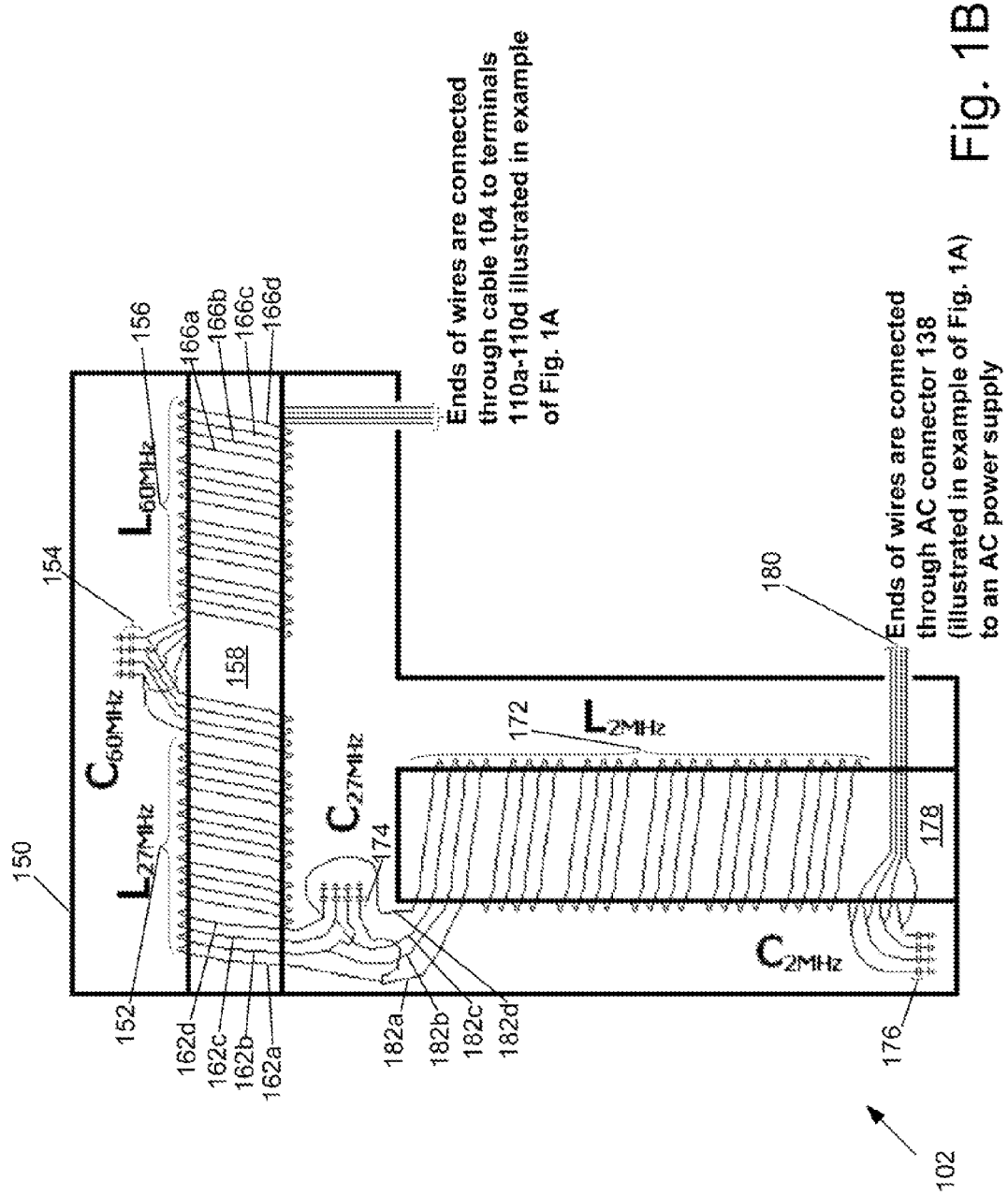
FIG. 1B shows a schematic representation illustrating an example prior-art RF power filter for use in a plasma processing system, such the plasma processing system illustrated in the example of FIG. 1A.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer-readable medium on which computer-readable instructions for carrying out embodiments of the inventive technique are stored. The computer-readable medium may include, for example, semiconductor, magnetic, opto-magnetic, optical, or other forms of computer-readable medium for storing computer-readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

One or more embodiments of the invention are related to a filter for filtering radio frequency (RF) power transmitted from at least an electrostatic chuck (ESC) in a plasma processing system. The plasma processing system may include a first heating element disposed at a first portion of the ESC and a second heating element disposed at a second portion of the ESC. The plasma processing system may further include a power supply, such an alternating current (AC) power supply, for powering the heating elements. The filter may filter or block RF power from being transmitted in one direction (thereby minimizing EMC failure, interference issues, and/or power loss issues) and may allow AC power (50 Hz or 60 Hz) to be transmitted in another direction to the heating elements.

The filter may include a core member for providing structural support to some components of the filter. The core member may be secured inside an enclosure of the filter.

The filter may also include a cable wound around and wound along at least a portion of the core member to form at least a set of inductors having a set of inductances. The cable may include a plurality of wires including a first wire, a second wire, a third wire, and a fourth wire. The first wire and the second wire may be connected to the first heating element for transmitting AC power to power the first heating element. The third wire and the fourth wire may be connected to the second heating element for transmitting AC power to power the second heating element.

The filter may also include a plurality of capacitors. The first wire, the second wire, the third wire, and the fourth may also be connected to four capacitors in the set of capacitors to form tuned circuits (or resonant circuits) for filtering out RF power at one or more operating frequencies (e.g., 60 MHz, 27 MHz, and/or 2 MHz) transmitted from the ESC.

The first wire, the second wire, the third wire, and the fourth wire may be twisted together (and may contact one another) to minimize the distances (or space) between the wires. As a result, the differences between the stray capacitances associated with the first wire, the stray capacitances associated with the second wire, the stray capacitances associated with the third wire, and the stray capacitances associated with the fourth wire may be minimized; and the impedances associated with the wires as measured at the ESC may be substantially equal. Advantageously, on each wafer processed in the plasma processing system, the plasma processing rates (e.g., etch rates) may be substantially uniform; the manufacturing yield may be maximized.

In one or more embodiments, the filter may include one or more positioning (and securing) mechanisms implemented at the core member for positioning and/or securing one or more portions of the cable. For example, the filter may include a groove structure, such as a helical groove structure, such that one or more portions of the cable may be disposed inside the groove structure and may substantially remain in specified position(s). Advantageously, the stray capacitances associated with the wires may remain substantially constant, and plasma processing profiles may be substantially consistent from wafer to wafer, from RF power filter to RF power filter, and/or from plasma processing chamber to plasma processing chamber given the same system specifications and the same processing recipes.

In one or more embodiments, a first portion of the cable may be wound around and wound along a first portion of the core member to form a first subset of inductors having a first subset of inductances, and a second portion of the cable may be wound around and wound along a second portion of the core member to form a second subset of inductors having a second subset of inductances (different from the first subset of inductances). Capacitors in the plurality of capacitors and the first subset of inductors may form tuned circuits (resonant circuits) to filter out RF power at a first operating frequency (e.g., 60 MHz) transmitted from the ESC; the same capacitors in the plurality of capacitors and the second subset of inductors may form other tuned circuits to filter out RF power at a second operating frequency (e.g., 27 MHz) transmitted from the ESC. In contrast with the above-discussed example prior-art filter 102 that requires two sets of capacitors for filtering out RF powers at two different frequencies, the filter in accordance with one or more embodiments of the invention may require only one set of capacitors. As a result, the effects of capacitor tolerances in plasma processing may be substantially reduced. Advantageously, consistency of plasma processing profiles on wafers, from RF power filter to RF power filter, and/or from plasma processing chamber to plasma processing chamber may be further improved.

One or more embodiments of the invention are related to a plasma processing system including a filter having one or more of the features discussed above. The plasma processing system may provide one or more of the abovementioned advantages.

The features and advantages of the present invention may be better understood with reference to the figures and discussions that follow.

Figure 2:
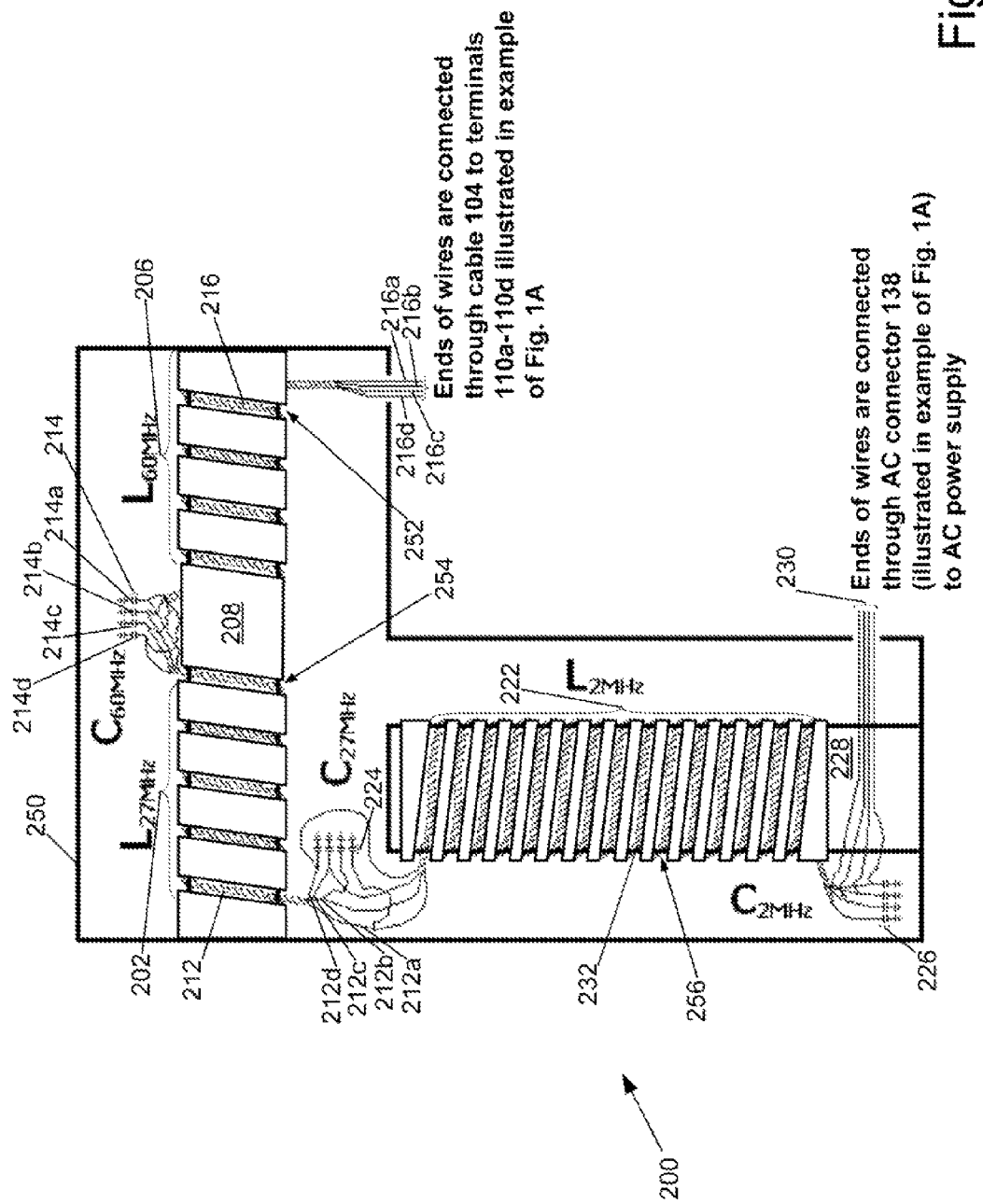
FIG. 2 shows a schematic representation illustrating an RF power filter for use in a plasma processing system, such the plasma processing system illustrated in the example of FIG. 1A, in accordance with one or more embodiments of the present invention.

FIG. 2 shows a schematic representation illustrating an RF power filter 200 (filter 200) for use in a plasma processing system, such as plasma processing system 100 illustrated in the example of FIG. 1A, in accordance with one or more embodiments of the present invention. Filter 200 may include an enclosure 250 for housing at least some components of filter 200. Filter 200 may also include a core member 208 disposed inside enclosure 250 and securely coupled with enclosure 250 for providing structural support for inductors and capacitors. Filter 200 may also include a plurality of grounded capacitors 214, including at least a capacitor 214a, a capacitor 214b, a capacitor 214c, and a capacitor 214d, at least for tuning impedances to reduce RF power loss from ESC 108 (illustrated in the example of FIG. 1A) for improving the plasma processing rate, for example, the etch rate. Filter 200 may also include a cable 216 wound around and wound along at least a portion of core member 208 to form a set of inductors 206 having a set of inductances. Inductors in the set of inductors 206 and capacitors in the plurality of grounded capacitors 214 may form tuned circuits (or resonant circuits) to filter out or block RF power at a certain operating frequency (e.g., 60 MHz) transmitted from ESC 108.

Cable 216 may include a plurality of wires, for example, coated magnet wires, such as solid double coated magnet copper wires.

The plurality of wires may include a wire 216a and a wire 216b. A first end of wire 216a may be connected through cable 104 and terminal 110a (illustrated in the example of FIG. 1A) to the first electric heating element disposed at ESC 108; a second end of wire 216a may be connected to capacitor 214a for forming a first resonant circuit and may be connected to a power supply (e.g., an AC power supply) through other wires for powering the first electric heating element. A first end of wire 216b may be connected through cable 104 and terminal 110b (illustrated in the example of FIG. 1A) to the first electric heating element; a second end of wire 216b may be connected to capacitor 214b for forming a second resonant circuit and may be connected to the power supply through other wires for powering the first electric heating element.

The plurality of wires may further include a wire 216c and a wire 216d. A first end of wire 216c may be connected to the second electric heating element disposed at ESC 108 through terminal 110c (illustrated in the example of FIG. 1A); a second end of wire 216c may be connected to capacitor 214c for forming a third resonant circuit and may be connected to the power supply through other wires for powering the second electric heating element. A first end of wire 216d may be connected to the second electric heating element through terminal 110d (illustrated in the example of FIG. 1A); a second end of wire 216d may be connected to capacitor 214d for forming a fourth resonant circuit and may be connected to the power supply through other wires for powering the second electric heating element.

The resonant circuits formed by wires 216a-216d and capacitors 214a-214d may filter out RF power at a certain operating frequency (e.g., 60 MHz) leaked or transmitted from ESC 108.

In one or more embodiments, at least a portion of wire 216a and at least a portion of wire 216b may be twisted together to minimize the distance (or space) between the portion of wire 216a and the portion of wire 216b, for minimizing the effect associated with the distance (or space). As a result, the differences between the stray capacitances associated with wire 216a and the stray capacitances associated with wire 216b may be minimized; and the impedances associated with wire 216a and the impedances associated with wire 216b at ESC (illustrated in the example of FIG. 1A) may be substantially equal. In one or more embodiments, at least a portion of wire 216c and at least a portion of wire 216d may be twisted together to minimize the distance between the portion of wire 216c and the portion of wire 216d.

In one or more embodiments, at least a portion of wire 216a and at least a portion of wire 216c may be twisted together to minimize the distance between the portion of wire 216a and the portion of wire 216c, for minimizing the effect associated with the distance. As a result, the differences between the stray capacitances associated with wire 216a and the stray capacitances associated with wire 216c may be minimized; and the impedances associated with wire 216a and the impedances associated with wire 216c at ESC 108 may be substantially equal. In one or more embodiments, at least a portion of wire 216b and at least a portion of wire 216d may be twisted together to minimize the distance between the portion of wire 216b and the portion of wire 216d.

In one or more embodiments, at least a portion of wire 216a, at least a portion of wire 216b, at least a portion of wire 216c, and at least a portion of wire 216d are twisted together to minimize the distances (or to minimize the effects of the distances) between the portion of wire 216a, the portion of wire 216b, the portion of wire 216c, and the portion of wire 216d. As a result, the differences between the stray capacitances associated with wires may be minimized; and the impedances associated with wires at ESC 108 may be substantially equal. Advantageously, on each wafer processed in the plasma processing system, the plasma processing rates (e.g., etch rates) may be substantially uniform; the manufacturing yield may be maximized.

In one or more embodiments, cable 216 may include six or more wires twisted together for supporting three or more electric heaters implemented at ESC 108.

Core member 208 may include a positioning mechanism for positioning at least a portion of cable 216 and/or securing the portion of cable 216 in place according to specifications. For example, core member 208 may include a groove structure 252 (e.g., a helical groove structure) for positioning and/or securing at least a portion (e.g., a helical inductor portion) of cable 216. At least the portion of cable 216 may be disposed inside groove structure 252. Since core member 208 may be securely coupled with enclosure 250, movement of the portion of cable 216 relative to the walls of enclosure 250 may be prevented or minimized. Accordingly, the stray capacitances associated with the wires in cable 216 and the walls of enclosure 250 may be substantially constant. Advantageously, embodiments of the invention may provide substantially consistent plasma processing profiles (e.g., etching profiles) from wafer to wafer, from RF power filter to RF power filter, and/or from plasma processing chamber to plasma processing chamber, without requiring the skill-intensive, time-consuming calibration processes required in the prior art.

For filtering out or blocking RF power at a second operating frequency (e.g., 27 MHz) transmitted from ESC 108 (illustrated in the example of FIG. 1A), filter 200 may further include a second plurality of grounded capacitors 224. Grounded capacitors 224 also may be implemented at least for tuning impedances to reduce RF power loss from ESC 108 for improving the plasma processing rate. Filter 200 may also include a cable 212 wound around and wound along at least a portion of core member 208 to form a second set of inductors 202 having a second set of inductances. Inductors in the second set of inductors 202 and capacitors in the second plurality of capacitors 224 may form tuned circuits (or resonant circuits) to filter out or block RF power at the second operating frequency (e.g., 27 MHz) transmitted from ESC 108.

Cable 212 also may include a plurality of wires, for example, wire 212a, wire 212b, wire 212c, and wire 212d. A first end of wire 212a may be connected to capacitor 214a and may be connected to the second end of wire 216a; a second end of wire 212a may be connected to a capacitor in the second plurality of capacitors 224 and may be connected to the power supply. Accordingly, similar to wire 216a, in addition to serving as an inductor, wire 212a may also server as a section of the connection between the power supply and the first electric heating element; wire 216a may be connected to the power supply through at least wire 212a. A first end of wire 212b may be connected to capacitor 214b and may be connected to the second end of wire 216b; a second end of wire 212b may be connected to another capacitor in the second plurality of capacitors 224 and may be connected to the power supply. Accordingly, similar to wire 216b, in addition to serving as an inductor, wire 212b may also serve as a section of the connection between the power supply and the first electric heating element; wire 216b may be connected to the power supply through at least wire 212b. Analogously, in addition to serving as inductors, wire 212c and wire 212d may serve as sections of the connections between the power supply and the second electric heating element.

Similar to the configurations of wires 216a-216d discussed above, at least portions of two or more of wires 212a-212d may be twisted together for achieving substantially uniform plasma processing rates on wafer processed in the plasma processing system.

Core member 208 may also include a second positioning mechanism, such as a helical groove structure 254, for positioning at least a portion of cable 212 and/or securing the portion of cable 212 in place according to specifications. Similar to groove structure 252, groove structure 254 may prevent or minimize the movement of cable 212, for maintaining the consistency of plasma processing profiles from wafer to wafer, from RF power filter to RF power filter, and/or from plasma processing chamber to plasma processing chamber.

For filtering out or blocking RF power at a third operating frequency (e.g., 2 MHz) transmitted from ESC 108 (illustrated in the example of FIG. 1A), filter 200 may further include a third plurality of grounded capacitors 226 also at least for tuning impedances to reduce RF power loss from ESC 108 for improving the plasma processing rate. Filter 200 may also include a cable 232 forming a third set of inductors 222 having a third set of inductances. Inductors in the third set of inductors 222 and capacitors in the third plurality of capacitors 226 may form tuned circuits (or resonant circuits) to filter out or block RF power at the third operating frequency (e.g., 2 MHz) transmitted from ESC 108.

Similar to wires in cable 216 and wires in cable 212, in addition to serving as inductors, wires in cable 232 may also serve as sections of the connections between the power supply and the electric heaters disposed at ESC 108. Wires in cable 232 may be connected through a set of wires 230 and AC connector 138 (illustrated in the example of FIG. 1A) to the power supply.

Similar to the configurations of wires in cable 216 and wires in cable 212 discussed above, at least portions of two or more of wires in cable 232 may be twisted together for achieving substantially uniform plasma processing rates on wafer processed in the plasma processing system.

For space and/or structural considerations, instead of being supported by core member 208, cable 232 may be supported by another core member 228 that is also disposed inside enclosure 250 and securely coupled with enclosure 250, but oriented differently from core member 208. At least a portion of cable 232 may be wound around and wound along at least a portion of core member 228 for forming the third set of inductors 222. Analogous to core member 208, core member 228 may include a positioning mechanism, such as a helical groove structure 256, for positioning at least a portion of cable 232 and/or securing the portion of cable 232 in place according to specifications. Analogous to groove structure 252 and groove structure 254, groove structure 256 may prevent or minimize the movement of cable 232, for maintaining the consistency of plasma processing profiles from wafer to wafer, from RF power filter to RF power filter, and/or from plasma processing chamber to plasma processing chamber.

One or more embodiments of the invention are related to plasma processing systems including RF power filters that have features and advantages same as or similar to those of filter 200.

Figure 3:
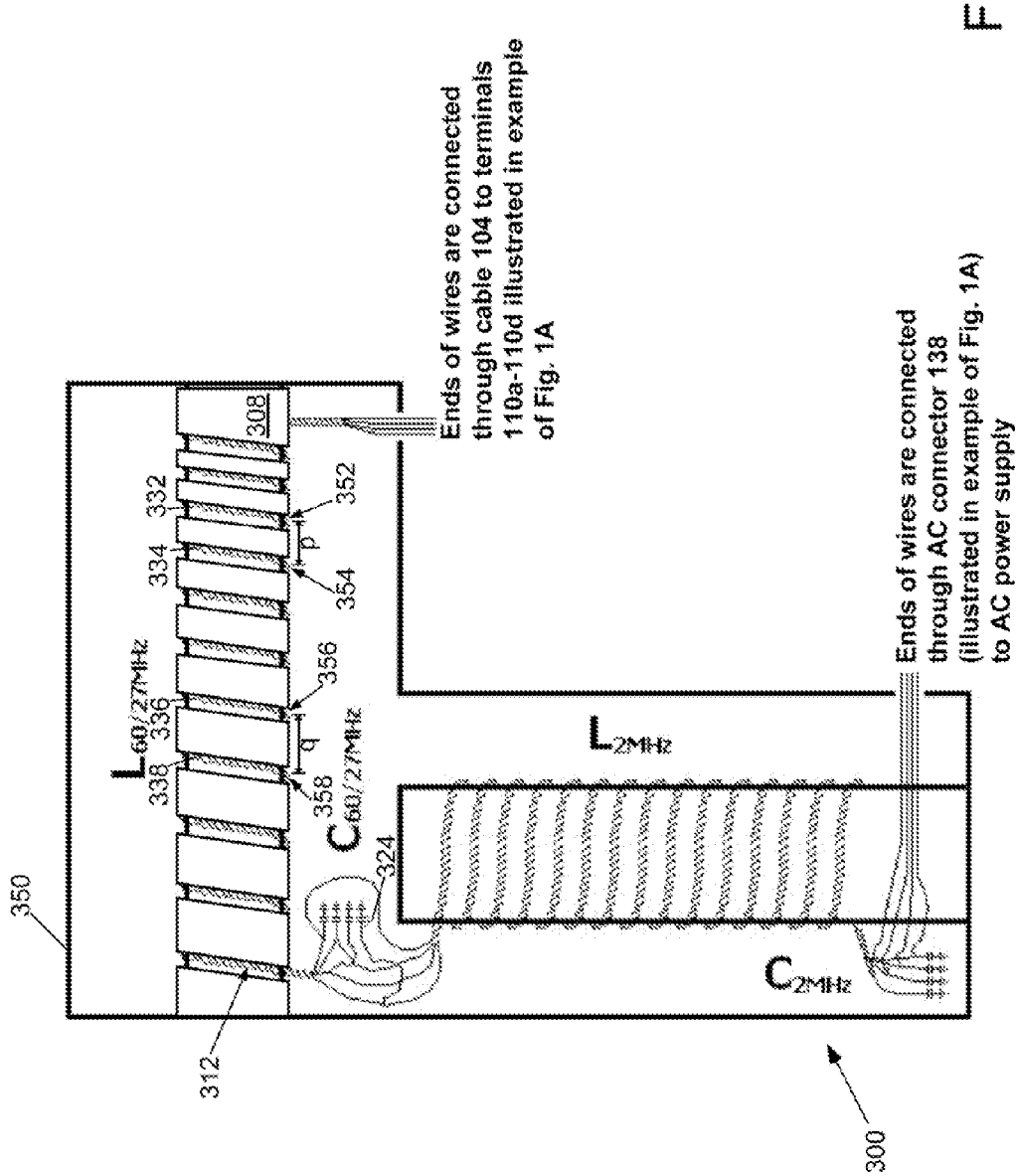
FIG. 3 shows a schematic representation illustrating an RF power filter for use in a plasma processing system, such the plasma processing system illustrated in the example of FIG. 1A, in accordance with one or more embodiments of the present invention.

FIG. 3 shows a schematic representation illustrating an RF power filter 300 (filter 300) for use in a plasma processing system, such as plasma processing system 100 illustrated in the example of FIG. 1A, in accordance with one or more embodiments of the present invention.

Similar to filter 200 illustrated in the example of FIG. 2, filter 300 may include tuned circuits (or resonant circuits), which are combinations of grounded capacitors (e.g., capacitors in the set of grounded capacitors 324) and inductors formed by wires (e.g., wires in a cable 312) wound around and wound along one or more core members (e.g., a core member 308) secured inside an enclosure 350, for filtering out RF power at different frequencies. In addition to forming the inductors, the wires may also couple one or more electric heating elements disposed at the ESC (e.g., ESC 108 illustrated in the example of FIG. 1A) with a power supply for powering the one or more electric heating elements. Two or more of the wires may be twisted together to minimize stray capacitance variations, for achieving substantially uniform plasma processing rates on wafers processed in the plasma processing system. One or more of the core members may include one or more positioning mechanisms (e.g., one or more groove structures) for positioning the wires (or one or more cables formed by the wires) to prevent or minimize the movement of the wires. Accordingly, stray capacitance variations may be minimized. Advantageously, substantial consistency in plasma processing profiles from wafer to wafer, from RF power filter to RF power filter, and/or from plasma processing chamber to plasma processing chamber May be provided, without requiring skill-intensive, time-consuming calibration processes.

In contrast with filter 200, which may include three sets of capacitors corresponding to three cables for filtering out RF power at three different operating frequencies, filter 300 may include only two sets of capacitors corresponding to two cables for filtering out RF power at three different operating frequencies. By reducing the use of capacitors, the effect of the tolerances of capacitors may be reduced. Advantageously, the consistency of plasma processing profiles on wafers, from RF power filter to RF power filter, and/or from plasma processing chamber to plasma processing chamber may be further improved.

For reducing the number of required capacitors, cable 312 may be employed for filtering out RF power at two or more frequencies, for example, 60 MHz and 27 MHz. In one or more embodiments, a first portion of cable 312 may be wound around and wound along a first portion of core member 308 to form a first subset of inductors having a first subset of inductances; a second portion of cable 312 may be wound around and wound along a second portion of core member 308 in a different manner to form a second subset of inductors having a second subset of inductances different from the first subset of inductances. The tuned circuits formed by the set of grounded capacitors 324 and the first subset of inductors may block RF power at a first frequency, e.g., 60 MHz; the tuned circuits formed by the same grounded capacitors 324 and the second subset of inductors may block RF power at a second frequency, e.g., 27 MHz.

For providing the different subsets of inductors having different subsets of inductances, cable 312 may be wound to have various pitches between neighboring cable portions. For example, cable 312 may be wound such that pitches between neighboring cable portions of the first portion of cable 312 may be different from pitches between neighboring cable portions of the second portion of cable 312. As an example, pitch p between neighboring cable portions 332 and 334 of cable 312 may be different from (e.g., smaller than) pitch q between neighboring cable portions 336 and 338 of cable 312. The values of the pitches may be optimized by one of ordinary skill in the art without undue experimentation.

For positioning the cable portions according to specified pitches and/or securing the cable portions in place according to the specified pitches, core member 308 may include a positioning mechanism, such as a groove structure, having various pitches according to the specified pitches between cable portions. For example, the groove structure may have a plurality of groove portions having various pitches between neighboring groove portions. As an example, pitch p between neighboring groove portions 352 and 354 may be different from (e.g., smaller than) pitch q between neighboring groove portions 356 and 358. The values of the pitches may be optimized by one of ordinary skill in the art without undue experimentation.

By implementing various pitches between cable portions of cable 312 (and various pitches between groove portions that hold the cable portions), only one cable (i.e., cable 312) and only one set of grounded capacitors (i.e., grounded capacitors 324) may be sufficient for blocking RF power at two different frequencies. Accordingly, the use of capacitors may be reduced, and the effect of tolerances of capacitors may be reduced. Advantageously, plasma processing uniformity and plasma processing profile consistency may be substantially improved. In addition, the manufacturing of filter 300 may be substantially simplified.

One or more embodiments of the invention are related to plasma processing systems including RF power filters that have features and advantages same as or similar to those of filter 300.

Figure 4:
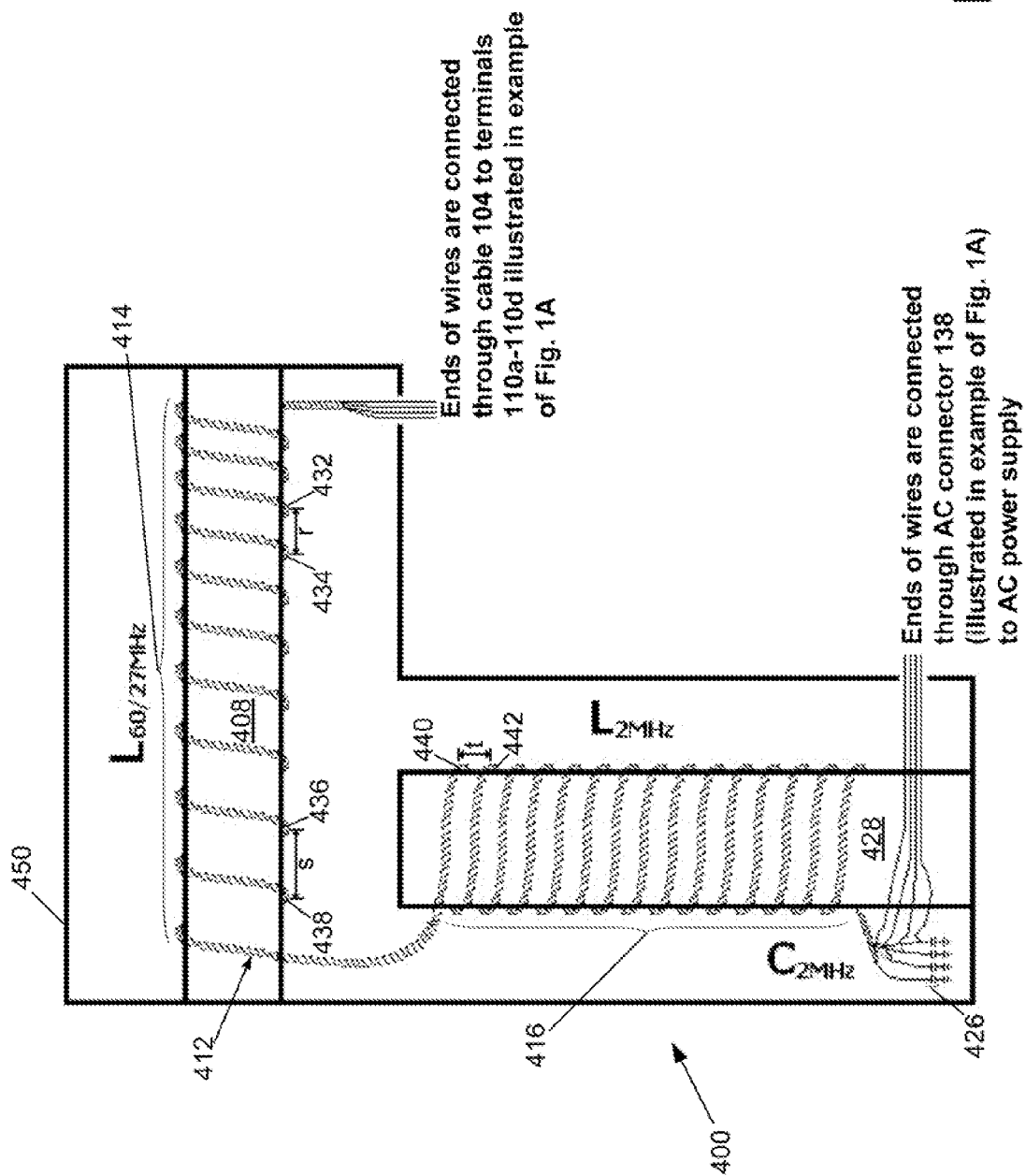
FIG. 4 shows a schematic representation illustrating an RF power filter for use in a plasma processing system, such the plasma processing system illustrated in the example of FIG. 1A, in accordance with one or more embodiments of the present invention.

FIG. 4 shows a schematic representation illustrating an RF power filter 400 (filter 400) for use in a plasma processing system, such as plasma processing system 100 illustrated in the example of FIG. 1A, in accordance with one or more embodiments of the present invention. Filter 400 may have one or more features (e.g., twisted wires secured at core members having positioning mechanisms) and one or more advantages of fitter 200 discussed with reference to the example of FIG. 2 and filter 300 discussed with reference to the example of FIG. 3. Nevertheless, in contrast with filter 200, which may include three sets of capacitors for forming tuned circuits to block RF power at three frequencies, and in contrast with filter 300, which may include two sets of capacitors for forming tuned circuits to block RF power at three frequencies, filter 400 may include only one set of capacitors for forming tuned circuits to block RF power at three frequencies.

Inside enclosure 450 of filter 400, a first portion 414 of cable 412 is wound around and wound along at least a portion of a first core member 408 to form a first set of inductors having a first set of inductances, and a second portion 416 of cable 412 is wound around and wound along at least a portion of a second core member 428 to form a second set of inductors having a second set of inductances different from the first set of inductances.

Similar to the implementation of filter 300 discussed with reference to the example of FIG. 3, various pitches are implemented between neighboring cable portions of portion 414 of cable 412 to enable portion 414 of cable 412 to form two subsets of inductors having two subsets of different inductances. For example, portion 414 of cable 412 may be wound such that pitches between neighboring cable portions of part of portion 414 of cable 412 may be different from pitches between neighboring cable portions of another part of portion 414 of cable 412. As an example, pitch r between neighboring cable portions 432 and 434 may be different from (e.g., smaller than) pitch s between neighboring cable portions 436 and 438. The pitches may be maintained by one or more positioning mechanisms (e.g., a helical groove structure illustrated in the example of FIG. 3) implemented at core member 408. As a result, a first subset of inductors having a first subset of inductances and a second subset of inductors having a second subset of inductances (different from the first subset of inductances) may be formed.

In addition, portion 416 of cable 412 may be wound such that pitches between neighboring cable portions of portion 416 of cable 412 may be different from pitches between neighboring cable portions of portion 414 of cable 412. For example, pitch t between neighboring cable portions 440 and 442 (at portion 416 of cable 412) may be different from (e.g., smaller than) pitch r between neighboring cable portions 432 and 434 (at portion 414 of cable 412) and may be different from (e.g., smaller than) pitch s between neighboring cable portions 436 and 438 (at portion 414 of cable 412). The pitches may be maintained by one or more positioning mechanisms (e.g., a helical groove structure illustrated in the example of FIG. 2) implemented at core member 428. As a result, the second set of inductors having the second set of inductances, or a third subset of inductors having a third subset of inductances different from the first subset of inductances and different from the second subset of inductances, may be formed. The values of the pitches may be optimized by one of ordinary skill in the art without undue experimentation.

The tuned circuits formed by the set of grounded capacitors 426 and the first subset of inductors may block RF power at a first frequency, e.g., 60 MHz. The tuned circuits formed by the same grounded capacitors 426 and the second subset of inductors may block RF power at a second frequency, e.g., 27 MHz. The tuned circuits formed by the same grounded capacitors 426 and the third subset of inductors may block RF power at a third frequency, e.g., 2 MHz. In filter 400, only one set of grounded capacitors, instead of two or three sets, is employed for blocking RF power at three different frequencies. Accordingly, the use of capacitors may be further reduced, and the effect of tolerances of capacitors may be further reduced. Advantageously, the manufacturing of RF power filters may be further simplified, and plasma processing uniformity and plasma processing profile consistency may be further improved.

In one or more embodiments, cable 412 may be wound to implement four or more subsets of inductors having four or more subsets of different inductances, for filtering out RF power at four or more different frequencies.

One or more embodiments of the invention are related to plasma processing systems including RF power filters that have features and advantages same as or similar to those of filter 400.

As can be appreciated from the foregoing, embodiments of the invention may include RF power filtering mechanisms with inductors formed by wires twisted together. Accordingly, the spacing between the wires may be minimized, and differences in stray capacitances associated with wires may be minimized. Advantageously, substantially uniform plasma processing rates on wafers may be achieved.

Embodiments of the invention may include positioning mechanisms for positioning and/or securing the wires that form the inductors in RF power filtering mechanisms. Accordingly, the stray capacitances associated with the wires may remain substantially constant. Advantageously, plasma processing profiles may be substantially consistent from wafer to wafer, from RF power filter to RF power filter, and/or from plasma processing chamber to plasma processing chamber.

Embodiments of the invention may implement various pitches between neighboring portions of wires that form the inductors in RF power filtering mechanisms. Accordingly, tuned circuits formed by only one or two sets of capacitors (instead of three sets) and only one or two sets of wires (instead of three sets of wires) may filter out RF power at three or more different frequencies. Embodiments of the invention may significantly reduce the use of capacitors in the RF power filtering mechanisms. Advantageously, consistency of plasma processing profiles on wafers, from RF power filter to RF power filter, and/or from plasma processing chamber to plasma processing chamber may be further improved.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A filter for filtering radio frequency (RF) power transmitted from an electrostatic chuck (ESC) in a plasma processing system, said plasma processing system including a first heating element disposed at a first portion of said ESC, said plasma processing system further including a power supply, said filter comprising:
   a first core member;
   a first plurality of capacitors, said first plurality of capacitors including at least a first capacitor and a second capacitor; and
   a first cable wound around and wound along at least a first portion of said first core member to form at least a first set of inductors having a first set of inductances, said first cable including at least a first plurality of wires, said first plurality of wires including at least a first wire and a second wire, said first wire contacting said second wire, at least a portion of said first wire and at least a portion of said second wire being twisted together, a first end of said first wire being connected to said first heating element, a second end of said first wire being connected to said first capacitor and being connected to said power supply; a first end of said second wire being connected to said first heating element, a second end of said second wire being connected to said second capacitor and being connected to said power supply;
   wherein said first core member includes at least a groove structure, at least a portion of said first cable being disposed inside said groove structure and
   wherein said groove structure includes at least a plurality of groove portions, said groove structure having various pitches between neighboring groove portions of said plurality of groove portions such that a first portion of said first cable forms a first subset of inductors having a first subset of inductances and that a second portion of said first cable forms a second subset of inductors having a second subset of inductances, said second subset of inductances being different from said first subset of inductances such that said first cable and said first plurality of capacitors are sufficient for blocking RF power at two different frequencies.

2. The filter of claim 1 wherein
   said plasma processing system further includes a second heating element disposed at a second portion of said ESC,
   said first plurality of capacitors further includes at least a third capacitor and a fourth capacitor,
   said first plurality of wires of said first cable further includes at least a third wire and a fourth wire, a first end of said third wire being connected to said second heating element, a second end of said third wire being connected to said third capacitor and being connected to said power supply; a first end of said fourth wire being connected to said second heating element, a second end of said fourth wire being connected to said fourth capacitor and being connected to said power supply, and
   said at least a portion of said first wire, said at least a portion of said second wire, at least a portion of said third wire, and at least a portion of said fourth wire are twisted together.

3. The filter of claim 1 wherein said first wire is a coated magnet wire.

4. The filter of claim 1 further comprising:
   a second core member;
   a second plurality of capacitors, said second plurality of capacitors including at least a third capacitor and a fourth capacitor; and
   a second cable wound around and wound along at least a portion of said second core member to form at least a second set of inductors, said second cable including at least a second plurality of wires, said second plurality of wires including at least a third wire and a fourth wire, said third wire contacting said fourth wire, said third wire and said fourth wire being twisted together, a first end of said third wire being connected to said first capacitor and being connected to said second end of said first wire, a second end of said third wire being connected to said third capacitor and being connected to said power supply; a first end of said fourth wire being connected to said second capacitor and being connected to said second end of said second wire, a second end of said fourth wire being connected to said fourth capacitor and being connected to said power supply; said first wire being connected to said power supply through at least said third wire, said second wire being connected to said power supply through at least said fourth wire.

5. The filter of claim 1 further comprising:
   a second plurality of capacitors, said second plurality of capacitors including at least a third capacitor and a fourth capacitor; and
   a second cable wound around and wound along at least a second portion of said first core member to form at least a second set of inductors, said second cable including at least a second plurality of wires, said second plurality of wires including at least a third wire and a fourth wire, said third wire contacting said fourth wire, said third wire and said fourth wire being twisted together, a first end of said third wire being connected to said first capacitor and being connected to said second end of said first wire, a second end of said third wire being connected to said third capacitor and being connected to said power supply; a first end of said fourth wire being connected to said second capacitor and being connected to said second end of said second wire, a second end of said fourth wire being connected to said fourth capacitor and being connected to said power supply; said first wire being connected to said power supply through at least said third wire, said second wire being connected to said power supply through at least said fourth wire.

6. The filter of claim 5 further comprising:
a second core member;
a third plurality of capacitors, said third plurality of capacitors including at least a fifth capacitor and a sixth capacitor; and
a third cable wound around and wound along at least a portion of said second core member to form at least a third set of inductors, said third cable including at least a third plurality of wires, said third plurality of wires including at least a fifth wire and a sixth wire, said fifth wire contacting said sixth wire, said fifth wire and said sixth wire being, twisted together, a first end of said fifth wire being connected to said third capacitor and being connected to said second end of said third wire, a second end of said fifth wire being connected to said fifth capacitor and being connected to said power supply; a first end of said sixth wire being connected to said fourth capacitor and being connected to said second end of said fourth wire, a second end of said sixth wire being connected to said sixth capacitor and being connected to said power supply; said first wire being connected to said power supply through at least said third wire and said fifth wire, said second wire being connected to said power supply through at least said fourth wire and said sixth wire.

7. A filter for filtering radio frequency (RF) power transmitted from an electrostatic chuck (ESC) in a plasma processing system, said plasma processing system including a first heating element disposed at a first portion of said ESC, said plasma processing system further including a power supply, said filter comprising:
a first core member;
a first plurality of capacitors, said first plurality of capacitors including at least a first capacitor and a second capacitor; and
a first cable wound around and wound along at least a first portion of said first core member to form at least a first set of inductors having a first set of inductances, said first cable including at least a first plurality of wires, said first plurality of wires including at least a first wire and a second wire, said first wire contacting said second wire, at least a portion of said first wire and at least a portion of said second wire being twisted together, a first end of said first wire being connected to said first heating element, a second end of said first wire being connected to said first capacitor and being connected to said power supply; a first end of said second wire being connected to said first heating element, a second end of said second wire being connected to said second capacitor and being connected to said power supply;
a second core member, wherein
a first portion of said first cable is wound around and wound along said at least a first portion of said first core member to form said first set of inductors,
a second portion of said first cable is wound around and wound along at least a portion of said second core member to form a second set of inductors having a second set of inductances, said second set of inductances being different from said first set of inductances, and
pitches between neighboring cable portions of said at least a first portion of said first cable are different from pitches between neighboring cable portions of said second portion of said first cable.

8. A plasma processing system for processing at least a wafer, said plasma processing system comprising:
an electrostatic chuck (ESC) for supporting said wafer;
a first heating element disposed at a first portion of said ESC;
a power supply for supplying power to said first heating element; and
a filter for filtering radio frequency (RF) power transmitted from said ESC, said filter including
a first core member,
a first plurality of capacitors, said first plurality of capacitors including at least a first capacitor and a second capacitor, and
a first cable wound around and wound along at least a portion of said first core member to form at least a first set of inductors, said first cable including at least a first plurality of wires, said first plurality of wires including at least a first wire and a second wire, said first wire contacting said second wire, at least a portion of said first wire and at least a portion of said second wire being twisted together, a first end of said first wire being connected to said first heating element, a second end of said first wire being connected to said first capacitor and being connected to said power supply; a first end of said second wire being connected to said first heating element, a second end of said second wire being connected to said second capacitor and being connected to said power supply;
said first core member includes at least a groove structure, at least a portion of said first cable being disposed inside said groove structure;
said groove structure includes at least a plurality of groove portions, said groove structure having various pitches between neighboring groove portions of said plurality of groove portions such that a first portion of said first cable forms a first subset of inductors having a first subset of inductances and that a second portion of said first cable forms a second subset of inductors having a second subset of inductances, said second subset of inductances being different from said first subset of inductances such that said first cable and said first plurality of capacitors are sufficient for blocking RF power at two different frequencies.

9. The plasma processing system of claim 8 further comprising a second heating element disposed at a second portion of said ESC, wherein
said first plurality of capacitors further includes at least a third capacitor and a fourth capacitor,
said first plurality of wires of said first cable further includes at least a third wire and a fourth wire, a first end of said third wire being connected to said second heating element, a second end of said third wire being connected to said third capacitor and being connected to said power supply; a first end of said fourth wire being connected to said second heating element, a second end of said fourth wire being connected to said fourth capacitor and being connected to said power supply, and
said at least a portion of said first wire, said at least a portion of said second wire, at least a portion of said third wire, and at least a portion of said fourth wire are twisted together.

10. The ma processing system of claim 8 wherein said first wire is a coated magnet wire.

11. The plasma processing system of claim 8, wherein said filter further includes a second core member, a first portion of said first cable is wound around and wound along said at least said portion of said first core member to form said first set of inductors, a second portion of said first cable is wound around and wound along at least a portion of said second core member to form a second set of inductors having a second set of inductances, said second set of inductances being different from said first set of inductances, and pitches between neighboring cable portions of said first portion of said first cable are different from pitches between neighboring cable portions of said second portion of said first cable.

12. The plasma processing system of claim 8 wherein said filter further includes at least:

a second plurality of capacitors, said second plurality of capacitors including at ea a third capacitor and a fourth capacitor, and a second cable wound around and wound along at least a second portion of said first core member to form at least a second set of inductors, said second cable including at least as second plurality of wires, said second plurality of wires including at least a third wire and a fourth wire, said third wire contacting said fourth wire, said third wire and said fourth wire being twisted together, a first end of said third wire being connected to said first capacitor and being connected to said second end of said first wire, a second end of said third wire being connected to said third capacitor and being connected to said power supply, a first end of said fourth wire being connected to said second capacitor and being connected to said second end of said second wire, a second end of said fourth wire being connected to said fourth capacitor and being connected to said power supply, said first wire being connected to said power supply through at least said third wire, said second wire being connected to said power supply through at least said fourth wire.

13. The plasma processing system of claim 12 wherein said filter further includes at least:

a second core member, a third plurality of capacitors, said third plurality of capacitors including at least a fifth capacitor and a sixth capacitor, and a third cable wound around and wound along at least a portion of said second core member to form at least a third set of inductors, said third cable including at least a third plurality of wires, said third plurality of wires including at least a fifth wire and a sixth wire, said fifth wire contacting said sixth wire, said fifth wire and said sixth wire being twisted together, a first end of said fifth wire being connected to said third capacitor and being connected to said second end of said third wire, a second end of said fifth wire being connected to said fifth capacitor and being connected to said power supply; a first end of said sixth wire being connected to said fourth capacitor and being connected to said second end of said fourth wire, a second end of said sixth wire being connected to said sixth capacitor and being connected to said power supply; said first wire being, connected to said power supply through at least said third wire and said fifth wire, said second wire being connected to said power supply through at least said fourth wire and said sixth wire.

14. The plasma processing system of claim 8 wherein said filter further includes at least:

a second core member, a second plurality of capacitors, said second plurality of capacitors including at least a third capacitor and a fourth capacitor, and a second cable wound around and wound along at least a portion of said second core member to form at least a second set of inductors, said second cable including at least a second plurality of wires, said second plurality of wires including at least a third wire and a fourth wire, said third wire contacting said fourth wire, said third wire and said fourth wire being twisted together, a first end of said third wire being connected to said first capacitor and being connected to said second end of said first wire, a second end of said third wire being connected to said third capacitor and being connected to said power supply; a first end of said fourth wire being, connected to said second capacitor and being connected to said second end of said second wire, a second end of said fourth wire being connected to said fourth capacitor and being connected to said power supply; said first wire being connected to said power supply through at least said, third wire, said second wire being connected to said power supply through at least said fourth wire.

* * * * *